United States Patent
Nishio et al.

(10) Patent No.: US 9,813,014 B2
(45) Date of Patent: Nov. 7, 2017

(54) SOLAR CELL ARRAY

(71) Applicant: KYOCERA CORPORATION, Kyoto (JP)

(72) Inventors: Yuta Nishio, Yasu (JP); Yusuke Yasuno, Otsu (JP); Kitae Hirayama, Otsu (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/033,053

(22) PCT Filed: Oct. 31, 2014

(86) PCT No.: PCT/JP2014/079064
§ 371 (c)(1),
(2) Date: Apr. 28, 2016

(87) PCT Pub. No.: WO2015/064740
PCT Pub. Date: May 7, 2015

(65) Prior Publication Data
US 2016/0285406 A1    Sep. 29, 2016

(30) Foreign Application Priority Data

Oct. 31, 2013   (JP) .................................. 2013-226569

(51) Int. Cl.
*F24J 2/52*    (2006.01)
*H01G 9/20*    (2006.01)
(Continued)

(52) U.S. Cl.
CPC ............. *H02S 20/23* (2014.12); *F24J 2/5207* (2013.01); *F24J 2/5258* (2013.01);
(Continued)

(58) Field of Classification Search
CPC  H02S 20/23; H02S 20/26; H02S 30/10; F24J 2/5207; F24J 2/5252; F24J 2/5258
See application file for complete search history.

(56) References Cited

U.S. PATENT DOCUMENTS

| | | | |
|---|---|---|---|
| 2003/0015637 A1* | 1/2003 | Liebendorfer | F24J 2/5205 248/237 |
| 2009/0229654 A1* | 9/2009 | Morita | F24J 2/4614 136/251 |
| 2014/0179133 A1* | 6/2014 | Redel | F24J 2/5207 439/121 |

FOREIGN PATENT DOCUMENTS

JP    2001-329664    11/2001

OTHER PUBLICATIONS

International Search Report in International Patent Application No. PCT/JP2014/079064, dated Apr. 21, 2015, in 2 pages.
(Continued)

*Primary Examiner* — Susan D Leong
(74) *Attorney, Agent, or Firm* — Duane Morris LLP

(57) ABSTRACT

A holding member of a solar cell array according to the present invention includes a first holding portion that holds a first side portion of a solar cell module and that extends along the first side portion, and a second holding portion that holds a second side portion and that extends along the second side portion. The first holding portion includes a covering portion, a first supporting portion, and a first side wall portion. The second holding portion includes a second supporting portion, a second side wall portion, an extending portion, and a pressing member.

4 Claims, 7 Drawing Sheets

(51) Int. Cl.
*H02S 30/10* (2014.01)
*H02S 20/23* (2014.01)
*H01L 31/048* (2014.01)

(52) U.S. Cl.
CPC ......... *H01G 9/2068* (2013.01); *H01L 31/048* (2013.01); *H02S 30/10* (2014.12); *Y02B 10/12* (2013.01); *Y02E 10/47* (2013.01); *Y02E 10/542* (2013.01)

(56) References Cited

OTHER PUBLICATIONS

Written Opinion of the International Searching Authority in International Patent Application No. PCT/JP2014/079064, dated Apr. 21, 2015 and Statement of Relevance of Non-English References Cited Therein, in 4 pages.

\* cited by examiner

SOLAR CELL ARRAY

TECHNICAL FIELD

The present invention relates to a solar cell array.

BACKGROUND ART

A solar cell array is installed on, for example, a roof of a building by mounting solar cell modules on racks. Therefore, from the viewpoint of, for example, ensuring safety and reducing construction time, the solar cell array is required to have good workability.

Accordingly, as a technique for improving the workability of the solar cell array, for example, the use of a structure in which solar cell modules are fitted into grooves in horizontal racks and the solar cell modules are pressed from thereabove is proposed (refer to, for example, Japanese Unexamined Patent Application Publication No. 2001-329664).

SUMMARY OF INVENTION

Technical Problem

However, although the above-described solar cell array has good workability, the solar cell array has a structure in which lower-side side portions of the solar cell modules are covered by pressing members that are long in correspondence with the lengths of side portions of the solar cell modules. Therefore, rainwater that has been made dirty by, for example, dust accumulates in stepped portions between the pressing members and the surfaces of the solar cell modules. Further, the rainwater that has accumulated in the stepped portions, for example, spreads to a light-receiving surface of each solar cell module due to, for example, surface tension and wind, as a result of which dirt, such as the dust, that has remained after the moisture has evaporated in this state tends to adhere to the light-receiving surfaces of the solar cell modules.

It is an object of the present invention to provide a solar cell array that can be easily constructed and to whose solar cell module dirt is less likely to adhere.

Solution to Problem

A solar cell array according to an embodiment of the present invention includes a first solar cell module and a second solar cell module that each include, at external peripheral edge portions in plan view, a first side portion and a second side portion that is opposite to the first side portion. The first solar cell module and the second solar cell module are arranged side by side in an inclination direction at an inclined surface in such a manner that the first solar cell module is tilted and disposed at a lower side of the inclined surface and the second solar cell module is tilted and disposed at an upper side of the inclined surface to cause the first side portion of the first solar cell module to face the second side portion of the second solar cell module. The solar cell array also includes a holding member that is interposed between the first side portion of the first solar cell module and the second side portion of the second solar cell module.

The holding member includes a first holding portion that holds the first side portion of the first solar cell module and that extends along the first side portion, and a second holding portion that holds the second side portion of the second solar cell module and that extends along the second side portion.

The first holding portion includes a covering portion that covers an upper end portion of the first side portion of the first solar cell module; a first supporting portion that sandwiches, together with the covering portion, the first side portion and supports a lower end portion of the first side portion; and a first side wall portion that is positioned between the covering portion and the first supporting portion and that faces the first side portion.

The second holding portion includes a second supporting portion that supports a lower end portion of the second side portion of the second solar cell module; a second side wall portion that faces the second side portion; a third supporting portion that is provided between the first side wall portion and the second side wall portion and that is provided below an upper end surface of the second side portion of the second solar cell module; and a pressing portion which is supported by the third supporting portion, which extends along the second side portion through a length that is less than a length of the second side portion in a longitudinal direction, and which sandwiches, together with the second supporting portion of the second holding portion, the second side portion and presses the upper end surface of the second side portion.

Advantageous Effects of Invention

In the solar cell array according to the present embodiment, workability is improved. In addition, for example, rainwater that contains dust or the like is, for example, smoothly discharged from a light-receiving surface of the solar cell module, and the dust or the like in the rainwater is less likely to adhere to the light-receiving surface of the solar cell module. Therefore, the light-receiving surface of the solar cell module is kept clean, as a result of which it is possible to reduce a reduction in generation efficiency.

DESCRIPTION OF EMBODIMENTS

Figure 1A:
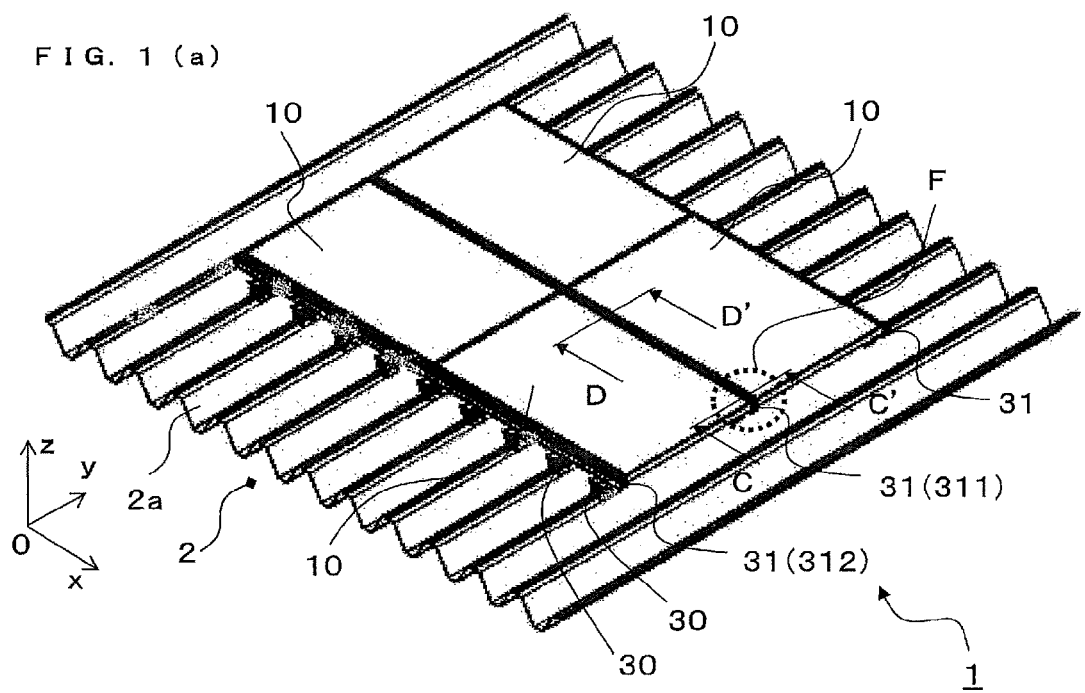
FIG. 1(a) is a perspective view of a state in which a solar cell array according to an embodiment of the present invention is installed on an installation surface.

Embodiments of a solar cell array according to the present invention are described in detail below with reference to the drawings. The figures are schematic views, and the sizes of and the positional relationships between various structures in each figure may be changed as appropriate.

<<First Embodiment>>
<Solar Cell Array>

As shown in FIGS. 1(a) and 1(b) and FIGS. 3(a) and 3(b), a solar cell array 1 according to an embodiment of the present invention is installed on, for example, an inclined roof 2, serving as an installation surface. The roof 2 is covered with roof decks 2a, serving as roof materials. In the following description, the direction of inclination of the roof 2 is a y-axis direction, a normal direction to the roof 2 is a z-axis direction, and a direction that is orthogonal to the y-axis direction and the z-axis direction is an x-axis direction. A high side of a slant of the roof 2 is a +y-axis direction (ridge side) and a low side of the slant of the roof 2 is a −y-axis direction (eaves side). The direction from the roof 2 towards the solar cell array 2 is a +z-axis direction. When upper is merely mentioned, this refers to the +z-axis direction. The opposite direction is a −z-axis direction. When lower is merely mentioned, this refers to the −z-axis direction.

The solar cell array 1 includes a rack 3 that is installed on the roof 2, and solar cell modules 10 that are secured to the rack 3 and whose external shapes are rectangular in plan view. The rack 3 includes, for example, supporting members 30 that are secured to the roof 2, holding members 31 (including pressing members 33), and securing members 32.

Figure 2:
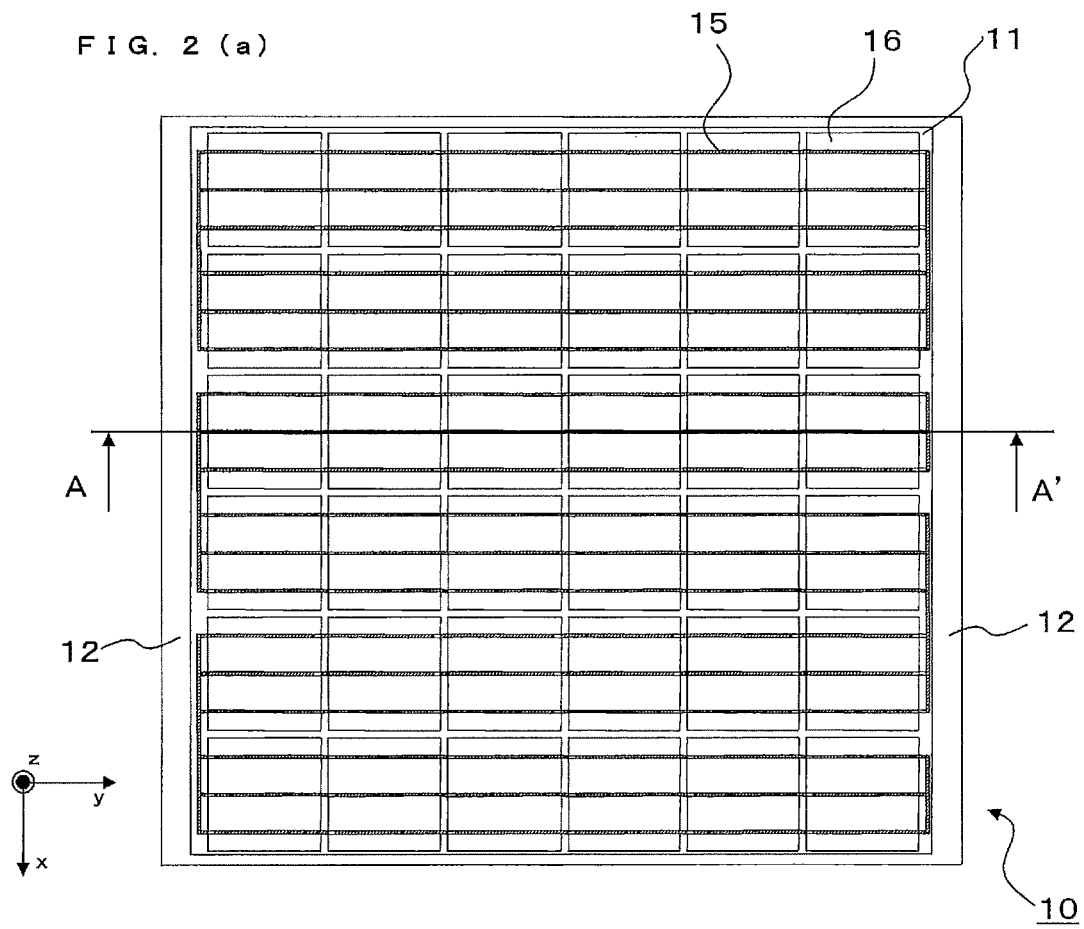
FIGS. 2(a) and 2(b) illustrate a solar cell module of the solar cell array according to the embodiment of the present invention, with FIG. 2(a) being a plan view of the solar cell module as seen from a light-receiving-surface side and FIG. 2(b) being a sectional view taken along line A-A' in FIG. 2(a).
Figure 2:
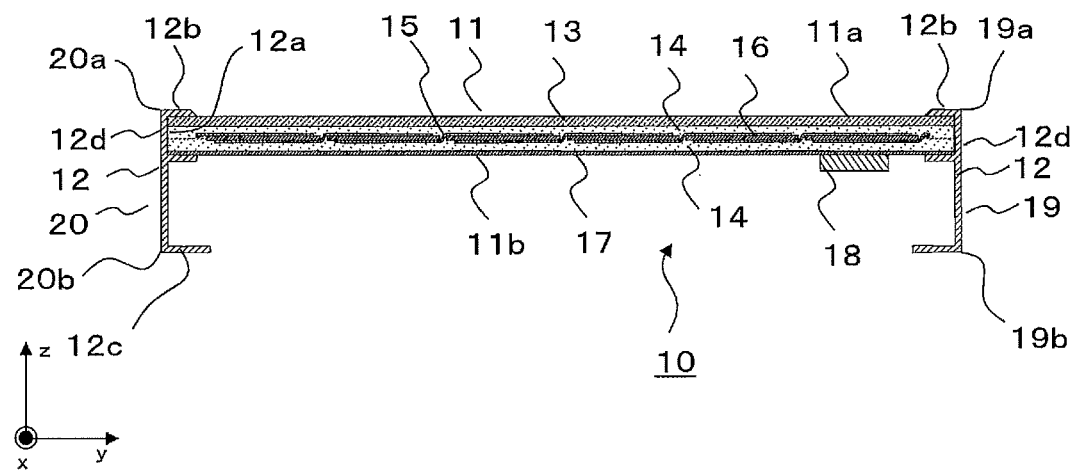

FIGS. 2(a) and 2(b) illustrate a detailed structure of the solar cell module 10. In the following description, when the rack 3 is installed on the roof 2, of the two holding members 31 that are positioned on two sides of the solar cell module 10, the holding member 31 that is positioned in the +y-axis direction is called a first holding member 311, and the holding member 31 that is positioned in the −y-axis direction is called a second holding member 312. For example, when it is not necessary to particularly distinguish and describe the first holding member 311 and the second holding member 312, each of these holding members is described as the holding member 31.

The solar cell array 1 includes at least two solar cell modules 10. Each solar cell module 10 includes, at external peripheral edge portions in plan view, a first side portion 19 and a second side portion 20 that is opposite to the first side portion 19. Here, two solar cell modules 10 that are inclined and are adjacent to each other are such that, along an inclination direction (+y-axis direction) at an inclined surface, the solar cell module 10 that is positioned at the lower side in the inclination direction is called a first solar cell module, and the solar cell module 10 that is positioned at the upper side in the inclination direction is called a second solar cell module. In the solar cell array 1, a holding member 31 is interposed between the first side portion 19 of the first solar cell module and the second side portion 20 of the second solar cell module.

Such holding member 31 includes a first holding portion and a second holding portion. The first holding portion is a portion that holds the first side portion 19 of the first solar cell module, and includes a portion that extends along the first side portion 19. The second holding portion is a portion that holds the second side portion 20 of the second solar cell module, and includes a portion that extends along the second side portion 20.

The first holding portion includes a covering portion 31f, a first supporting portion 31d, and a first side wall portion 31a. The covering portion 31f is a portion that covers a first upper end portion 19a, which is an upper end portion, of the first side portion 19 of the first solar cell module. The first supporting portion 31d is a portion that sandwiches, together with the covering portion 31f, the first side portion 19 and supports a first lower end portion 19b, which is a lower end portion, of the first side portion 19. The first side wall portion 31a is a portion that is positioned between the covering portion 31f and the first supporting portion 31d, and that faces the first side portion 19.

The second holding portion includes a second supporting portion 31e, a second side wall portion 31b, an extending portion 31c, which is a third supporting portion, and the pressing member 33, which is a pressing portion. The second supporting portion 31e is a portion that supports a second lower end portion 20b, which is a lower end portion, of the second side portion 20 of the first solar cell module. The second side wall portion 31b is a portion that faces the second side portion 20. The extending portion 31c is a portion that is provided between the first side wall portion and the second side wall portion 31b, and is provided below a second upper end portion 20a including an upper end surface of the second side portion 20. The pressing member 33 is a member which is supported by the extending portion 31c, which extends along the second side portion 20 through a length that is less than the length of the second side portion 20 in a longitudinal direction, and which sandwiches, together with the second supporting portion 31e, the second side portion 20 and presses the second upper end portion 20a of the second side portion 20.

Although the first holding member 311 and the second holding member 312 may have the same structure, they may have different structural features as long as they have the above-described structure. The first holding portion of the first holding member 311 may include the covering portion 31f that covers the first upper end portion 19a of the first side portion 19 of the solar cell module 10, the first supporting portion 31d that supports the first lower end portion 19b of the first side portion 19, the first side wall portion 31a that is positioned between the covering portion 31f and the first supporting portion 31d and that faces the first side portion 19, and an extending portion 31c of the first holding member 311 that is provided at an outer side from a back surface of the first side wall portion 31a.

The second holding portion of the second holding member 312 may include the second supporting portion 31e that supports the second lower end portion 20b of the second side portion 20, the second side wall portion 31b that faces the second side portion 20, and the extending portion 31c that is provided at an outer side from a back surface of the second side wall portion 31b (surface disposed in a direction that is opposite to the direction where the first side portion 19 is positioned) and whose upper surface is positioned below the second upper end portion 20a of the second side portion 20.

Further, an upper portion of the extending portion 31c of the second holding member 312 is provided with the pressing member 33 whose length is less than the length of the second side portion 20 in the longitudinal direction and which sandwiches, together with the second supporting portion 31e, the second side portion 20 and presses the upper end surface of the second side portion 20.

<Solar Cell Module>

Figure 1B:
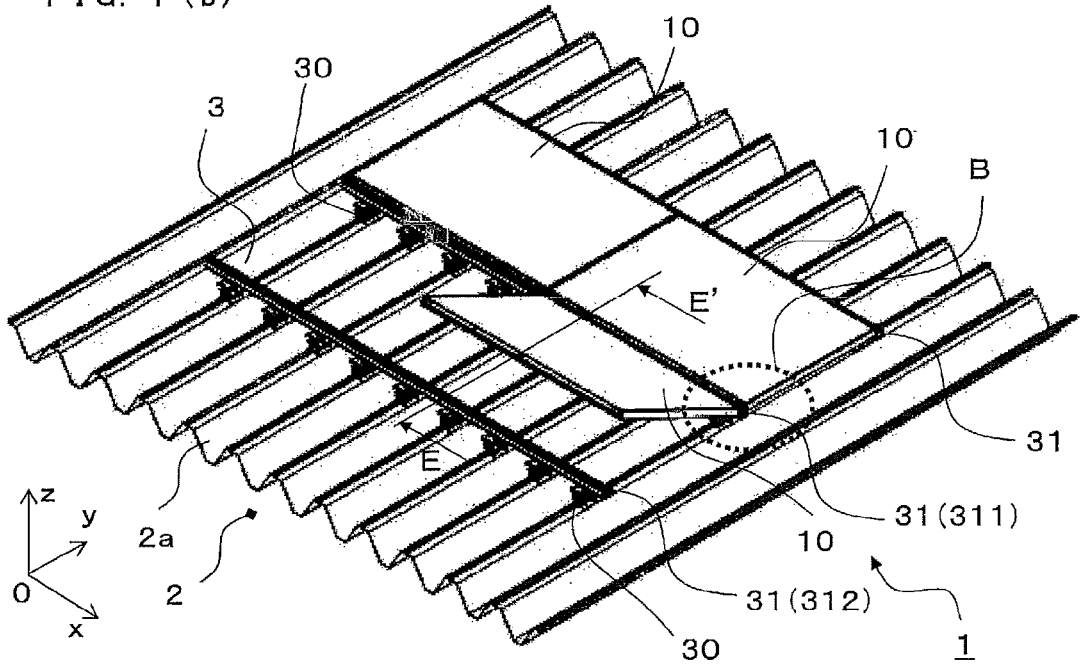
FIG. 1(b) is a perspective view of a state in which one of solar cell modules has been removed from the solar cell array shown in FIG. 1(a).

As shown in FIGS. 1(a) and 1(b), the plurality of solar cell modules 10 are arranged in the x-axis direction and also in the y-axis direction. As shown in FIGS. 2(a) and 2(b), each solar cell module 10 includes a solar cell panel 11 and a frame member 12 that reinforces outer edge portions of the solar cell panel 11.

As shown particularly in FIG. 2(b), each solar cell panel 11 includes a first principal surface (light-receiving surface) 11a (one principal surface of a light-transmissive substrate 13) that primarily receives light, and a second principal surface 11b (one principal surface of a back-surface protecting member 17) that corresponds to a back side of the first principal surface 11a. Each solar cell panel 11 includes, from a side of the first principal surface 11a, the light-transmissive substrate 13, also serving as a substrate of the solar cell module 10, a pair of sealing materials 14, made of a thermosetting resin, and a plurality of solar cell elements 16, electrically connected by an inner lead 15.

Further, each solar cell panel 11 includes the back-surface protecting member 17 that protects the back surface of the solar cell module 10, and a terminal box 18 for extracting an output acquired by the solar cell elements 16 to the outside.

A second-principal-surface-11b side of each solar cell panel 11 may have a structure that transmits light. For example, the back-surface protecting members 17 and the sealing materials 14 that are each positioned between the back-surface protecting member 17 and the solar cell elements 16 may each be made of a light-transmissive material.

For each solar cell element 16, for example, a flat substrate made of a monocrystalline silicon or a polycrystalline silicone is used. When such silicon substrates are used, as described above, the silicon substrates that are adjacent to each other only need to be electrically connected by the inner lead 15.

The type of solar cell elements 16 is not particularly limited to certain types. For example, as the solar cell elements 16, thin-film solar cells made of amorphous silicon, CIGS solar cells, CdTe solar cells, or solar cell elements 16 in which thin-film amorphous silicon is formed on a crystalline silicon substrate may be used. For example, as the solar cell elements 16 that are made of amorphous silicon, CIGS, or CdTe, those in which an amorphous silicon layer, a CIGS layer, or a CdTe layer is combined with a transparent electrode or the like, and the combination is stacked on the light-transmissive substrate 13 as appropriate may be used.

Each terminal box 18 may include, for example, a box member made of a modified polyphenylene ether (modified PPE) resin or a polyphenylene oxide (PPO) resin; a terminal plate that is disposed in the box member; and an output cable that leads electric power out of the box member.

Each frame member 12 has the function of holding the corresponding solar cell panel 11. Each frame member 12 includes a fitting portion 12a that is fitted to the corresponding solar cell panel 11 when the solar cell array 1 that is described later is installed, a frame upper surface 12b that is positioned at a side where sunlight is received, a frame lower surface 12c that is positioned at the back side of the frame upper surface 12b, and frame side surfaces 12d that connect the frame upper surface 12b and the frame lower surface 12c. Such frame members 12 may be produced by, for example, extrusion-molding of aluminum or the like.

In the description below, when the solar cell modules 10 are installed on the roof, it is assumed that each first side portion 19 includes the corresponding frame member 12 that is positioned at the ridge side. In addition, it is assumed that each second side portion 20 includes the corresponding frame member 12 at the eaves side. Of each first side portion 19, a portion where the corresponding frame upper surface 12b and the corresponding frame side surface 12d intersect is called the first upper end portion 19a. A portion that corresponds to the frame lower surface 12c is called the first lower end portion 19b. Similarly, of each second side portion 20, a portion where the corresponding frame upper surface 12b and the corresponding frame side surface 12d intersect is called the second upper end surface 20a. In addition, a portion that corresponds to the frame lower surface 12c is called the second lower end portion 20b.

<Rack>

Next, with reference to FIGS. 1(a), 1(b), 3(a), 3(b), 4(a), and 4(b), the rack 3 that secures each solar cell module 10 to the roof 2 is described in detail. The rack 3 includes the supporting members 30 that are installed on the roof 2, and the holding members 31 that are secured to the supporting members 30 by the securing members 32. In addition, the rack 3 includes the pressing members 33 for securing the solar cell modules 10 to the holding members 31.

As shown in FIGS. 3(a), 3(b), 4(a), and 4(b), each supporting member 30 includes a securing portion 30a that is secured to the roof 2 and a placement portion 30b that is installed on the securing portion 30a.

Figure 3:
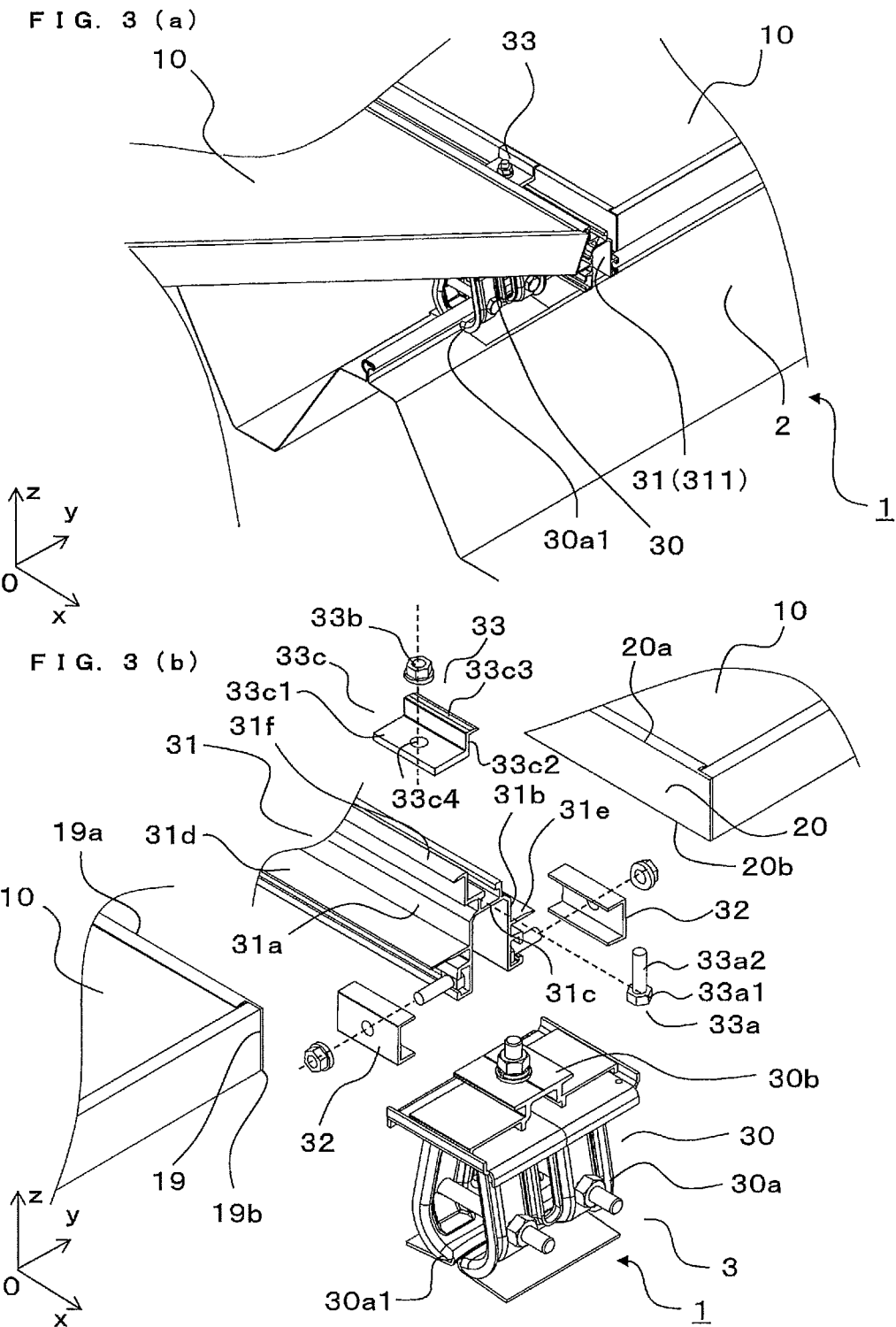
FIGS. 3(a) and 3(b) illustrate the solar cell array according to the embodiment of the present invention, with FIG. 3(a) being an enlarged perspective view of a portion B shown in FIG. 1(b) and FIG. 3(b) being an exploded perspective view of the structure shown in FIG. 3(a).
Figure 4:
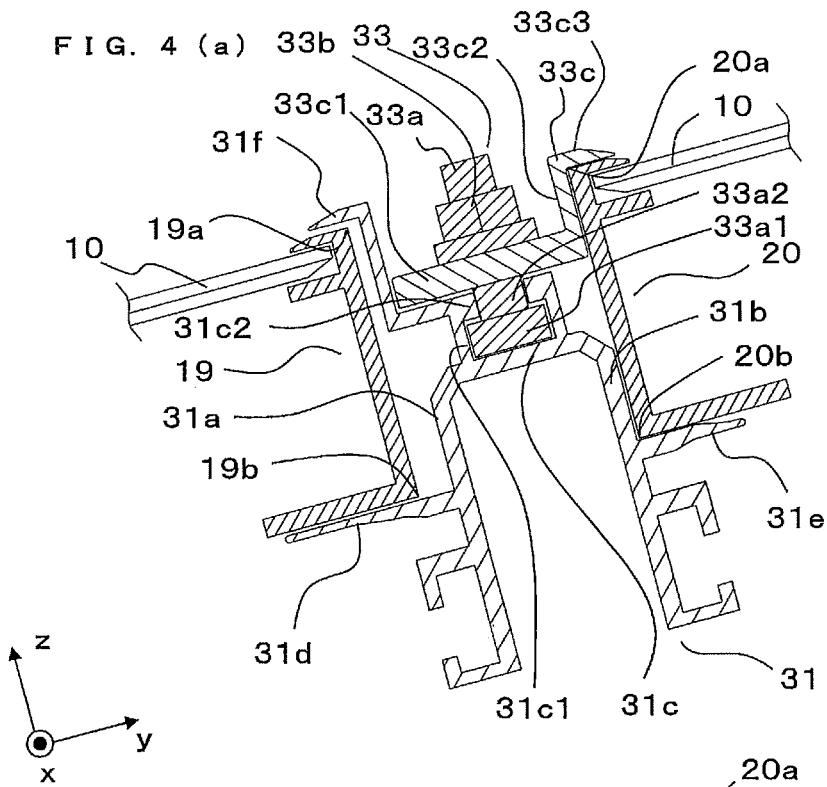
FIGS. 4(a) and 4(b) illustrate the solar cell array according to the embodiment of the present invention, with FIG. 4(a) being a sectional view taken along line C-C' in FIG. 1(a) and FIG. 4(b) being a sectional view taken along line D-D' in FIG. 1(a).
Figure 4:
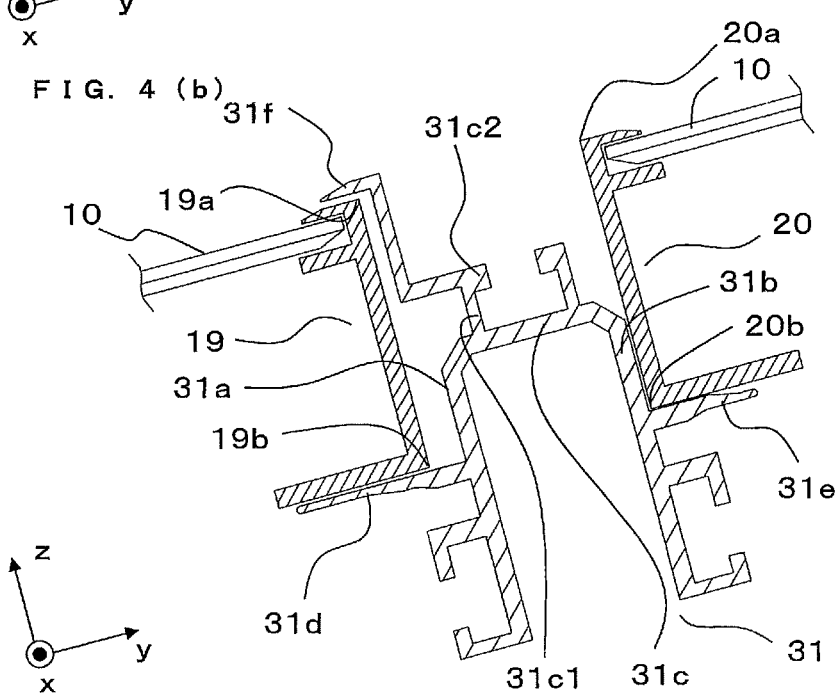

Each securing portion 30a is a member used for securing the corresponding supporting member 30 to the roof 2. For example, as shown in FIGS. 3(a) and 3(b), when the roof materials of the roof 2 are roof decks, the securing portions 30a are secured to the roof 2 by sandwiching protrusions of the roof decks by leg portions 30a1. The placement portions 30b are provided at the upper side of the securing portions 30a. Each supporting member 30 supports the corresponding holding member 31 from therebelow by the placement portion 30b. Each holding member 31 is secured to the corresponding placement portion 30b by the corresponding securing member 32.

As shown in FIGS. 3(a), 3(b), 4(a), and 4(b), each holding member 31 is a member that is supported on the corresponding supporting member 30 and that holds the corresponding solar cell module 10. Each holding member 31 includes a downwardly facing recessed portion. Each holding member 31 is a portion that has, for example, a length that is substantially an integral multiple of the length of the corresponding solar cell module 10 in the x-axis direction. Each holding member 31 includes the first side wall portion 31a that faces the first side portion 19 of the corresponding solar cell module 10, and the second side wall portion 3 1b that opposes the corresponding first side wall portion 31a and that faces the second side portion 20 of the corresponding solar cell module 10.

In addition, each holding member 31 includes the first supporting portion 31d that is disposed at a lower portion of the corresponding first side wall portion 31a and that supports the first lower end portion 19b of the corresponding solar cell module 10. Each holding member 31 includes the second supporting portion 31e that is disposed at a lower portion of the corresponding second side wall portion 31b and that supports the second lower end portion 20b of the corresponding solar cell module 10. Further, each holding member 31 includes the covering portion 31f that is disposed at an upper portion of the corresponding first side wall portion 31a and that covers the first upper end portion 19a of the corresponding solar cell module 10.

Each extending portion 31c connects the corresponding first side wall portion 31a and the corresponding second side wall portion 31b. Each extending portion 31c is provided to connect an intermediate portion of the corresponding first side wall portion 31a and an upper portion of the corresponding second side wall portion 31b; and, in the z-axis direction, is disposed below the second upper end surface 20a of the corresponding solar cell module 10. In addition, each extending portion 31c includes a recessed portion 31c1 that is formed, as a portion thereof, at an upper side thereof and that extends in a longitudinal direction of the corresponding holding member 31. An inlet of each recessed portion 31c1 corresponds to an opening portion 31c2. The width of each opening portion 31c2 is less than that of each recessed portion 31c1.

Each recessed portion 31c1 accommodates a head 33a1 of a bolt 33a described below. It is possible to cause only each threaded portion 33a2 to protrude from the corresponding opening portion 31c2 while preventing each head 33a1 from being removed from the corresponding opening portion 31c2. That is, the width of each opening portion 31c2 is greater than the diameter of the corresponding threaded portion 33a2, and is less than the diameter of the corresponding head 33a1.

Each pressing member 33 is a member for pressing the corresponding solar cell module 10 towards the corresponding holding member 31 and securing the corresponding solar cell module 20 to the corresponding holding member 31. Each pressing member 33 includes the bolt 33a, a nut 33b, and a stopper 33c. Each stopper 33c is secured to the corresponding holding member 31 by using the corresponding bolt 33a and the corresponding nut 33b.

Each stopper 33c includes a plate-shaped portion 33c1 that faces the opening portion 31c2 of the extending portion 31c of the corresponding holding member 31, a connecting portion 33c2 that stands from an end portion of the corresponding plate-shaped portion 33c1 near the corresponding second side portion 20, and a retaining portion 33c3 that projects from an upper end of the corresponding connecting portion 33c2 towards the second side portion 20 of the corresponding solar cell module 10. Accordingly, the sectional shape of each stopper 33c has the shape of a crank. The length of each stopper 33c in the longitudinal direction of the holding member 31 is less than the length of the corresponding solar cell module 10 in the longitudinal direction of the corresponding second side portion 20.

Each stopper 33c can be mounted on a top portion of the extending portion 31c of the corresponding holding member 31, which is positioned below the corresponding second upper end surface 20a; can sandwich, together with the second supporting portion 31e of the corresponding holding member 31, the second side portion 20 of the corresponding solar cell module 10; and can press and secure the corresponding second upper end surface 20a.

Each bolt 33a may be one including the corresponding threaded portion 33a2 and the corresponding head 33a1 whose sides are parallel to each other in plan view, such as a hexagon head bolt or a square head bolt. As described above, the head 33a1 of each bolt 33a is accommodated in the recessed portion 31c1 of the corresponding holding member 31. Each bolt 33a is disposed such that at least one side of its head 33a1 contacts an inside wall defining the corresponding recessed portion 31c1, so that the rotation of each bolt 33a is stopped. Although this makes it possible for each bolt 33a to move in the corresponding recessed portion 31c1 in the longitudinal direction of the corresponding holding member 31, the rotation of each bolt 33a can be stopped.

Each nut 33b is a nut that is combined with its corresponding bolt 33a. More specifically, each nut 33b engages with its corresponding threaded portion 33a2. Such bolts 33a and nuts 33b may be made of, for example, stainless steel on which, for example, surface treatment using, for example, chromium plating or zinc has been performed.

The plate-shaped portion 33c1 of each stopper 33c includes a through hole 33c4 that is positioned in correspondence with the position of the corresponding opening portion 31c2. Each stopper 33c is positioned such that at least a portion of the corresponding opening portion 31c2 and the corresponding through hole 33c4 overlap each other. By inserting the threaded portion 33a2 of each bolt 33a into the corresponding opening portion 31c2 and the corresponding through hole 33c4, the threaded portion 33a2 of each bolt 33a is secured by its corresponding nut 33b. In the embodiment, the size of each opening portion 31c2 and the size of each through hole 33c4 are substantially the same, but are not limited thereto. In the embodiment, since each threaded portion 33a2 only needs to be insertable into a portion where the corresponding opening portion 31c2 and the corresponding through hole 33c4 overlap each other, the opening portions 31c2 and the through holes 33c4 may have different sizes. Here, each portion where the opening portion 31c2 and the through hole 33c4 overlap each other only needs to be smaller than the outside diameter of the corresponding nut 33b.

<Construction Steps>

The steps for mounting a solar cell module 10 between the first holding member 311 and the second holding member 312 are described below.

Figure 5:
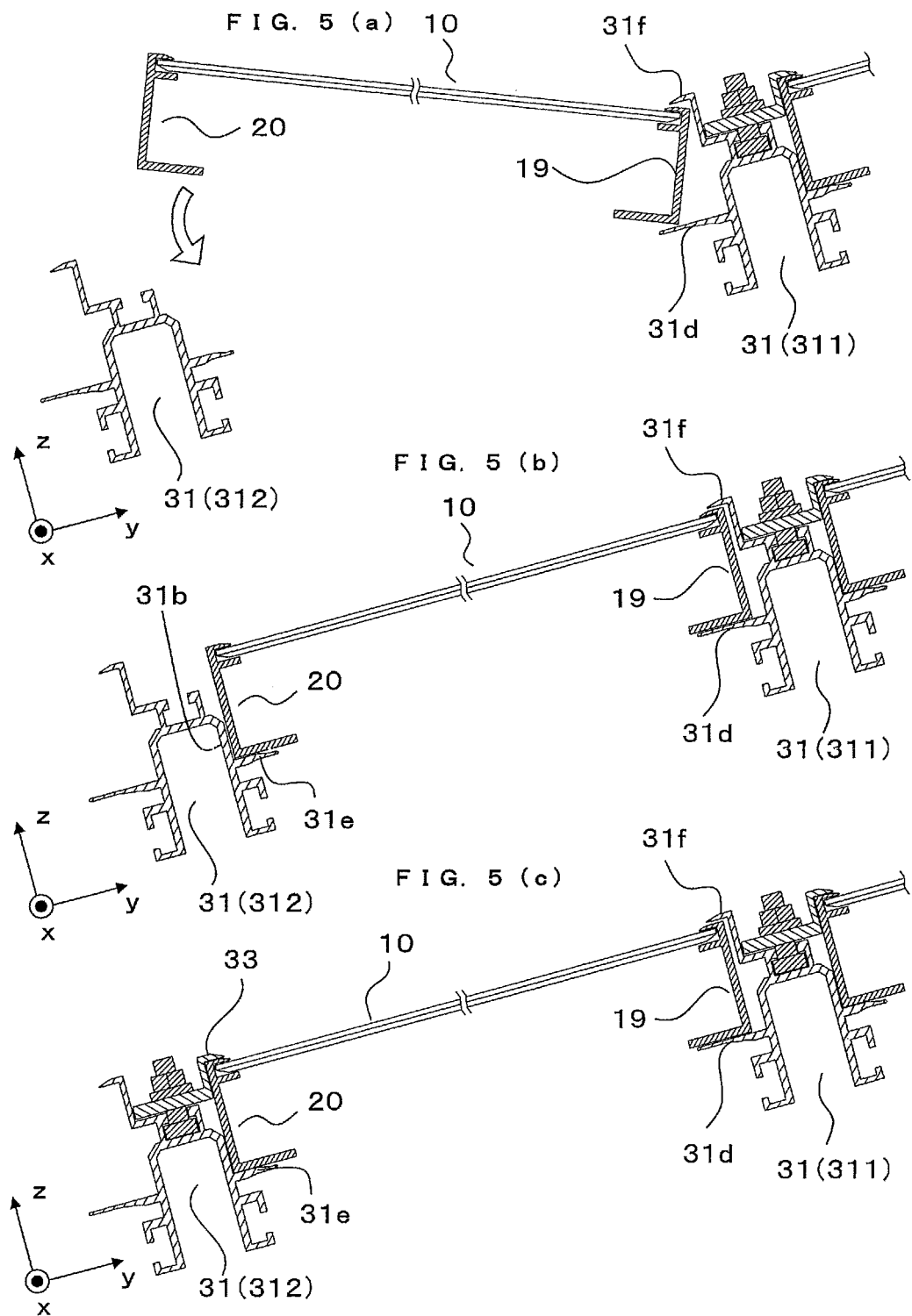
FIGS. 5(a) to 5(c) illustrate the solar cell array according to the embodiment of the present invention, and is a sectional view showing the order of construction of a portion corresponding to a section along line E-E' in FIG. 1(b).

First, as shown in FIG. 5(a), the first side portion 19 of the solar cell module 10 is inserted between the first supporting portion 31d and the covering portion 31f of the first holding member 311. Then, the second side portion 20 is rotated around the first-side-portion-19 side of the solar cell module 10 towards the second holding member 312, and, as shown in FIG. 5(b), the second side portion 20 is placed on the second supporting portion 31e. At this time, the second side portion 20 of the solar cell module 10 is supported by the second side wall portion 31b of the second holding member 312, and the solar cell module 10 is temporarily stopped between the first holding member 311 and the second holding member 312. Then, as shown in FIG. 5(c), the pressing member 33 is mounted on the extending portion 31c of the second holding member 312 to secure the second side portion 20 of the solar cell module 10. This causes the solar cell module 10 to be mounted between the first holding member 311 and the second holding member 312.

<Advantages>

By the above, in the embodiment, when the solar cell module 10 is placed between the first holding member 311 and the second holding member 312 that are adjacent to each other in the y-axis direction, the first lower end portion 19b of the solar cell module 10 and the second lower end portion 20b of the solar cell module 10 are supported by the first supporting portion 31d of the first holding member 311 and the second supporting portion 31e of the second holding member 312, and the second side wall portion 31b of the second holding member 312 holds the solar cell module 10, so that the solar cell module 10 is less likely to slide. This makes it possible to easily temporarily stop the solar cell module 10 by using a simple structure.

Then, the first side portion 19, which is a member at the ridge side of the solar cell module 10, is inserted and sandwiched between the first supporting portion 31d and the covering portion 31f of the first holding member 311. On the other hand, the second side portion 20, which is a member at the eaves side of the solar cell module, is pressed with respect to the second supporting portion 31e of the second holding member 312 by the pressing member 33, and is secured thereto. This makes it possible to easily secure the solar cell module 10 without the need for a worker to get onto the solar cell module 10, so that the solar cell array 1 having good workability can be provided.

Further, at the second side portion 20, which is positioned at the eaves side of the solar cell module 10, the extending portion 31c of the second holding member 312 is positioned below the second upper end surface 20a of the solar cell module 10 when seen in the z-axis direction. Moreover, since the second side portion 20 is secured to the pressing member 33 that is shorter than the second side portion 20, a large amount of, for example, rainwater that has been made dirty by dust or the like will not accumulate on the first principal surface 11a of the solar cell panel 11 that primarily receives light, and, for example, the rainwater that has been made dirty can be, for example, smoothly discharged from portions where the pressing member 33 is not disposed. Therefore, the dust or the like is less likely to adhere to the first principal surface 11a of the solar cell panel 11, so that the first principal surface 11a is kept clean. Consequently, the generation efficiency of the solar cell array 1 can be kept high.

<<Second Embodiment>>

Figure 6:
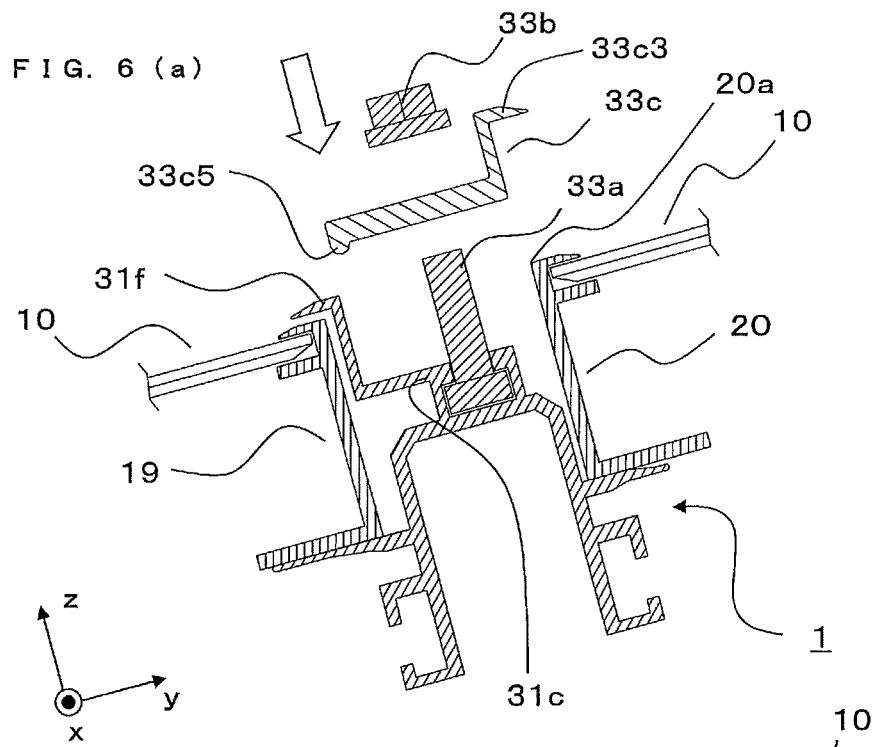
FIGS. 6(a) and 6(b) each illustrate a solar cell array according to another embodiment of the present invention, and are sectional views of the portions shown in FIGS. 4(a) and 4(b).
Figure 6:
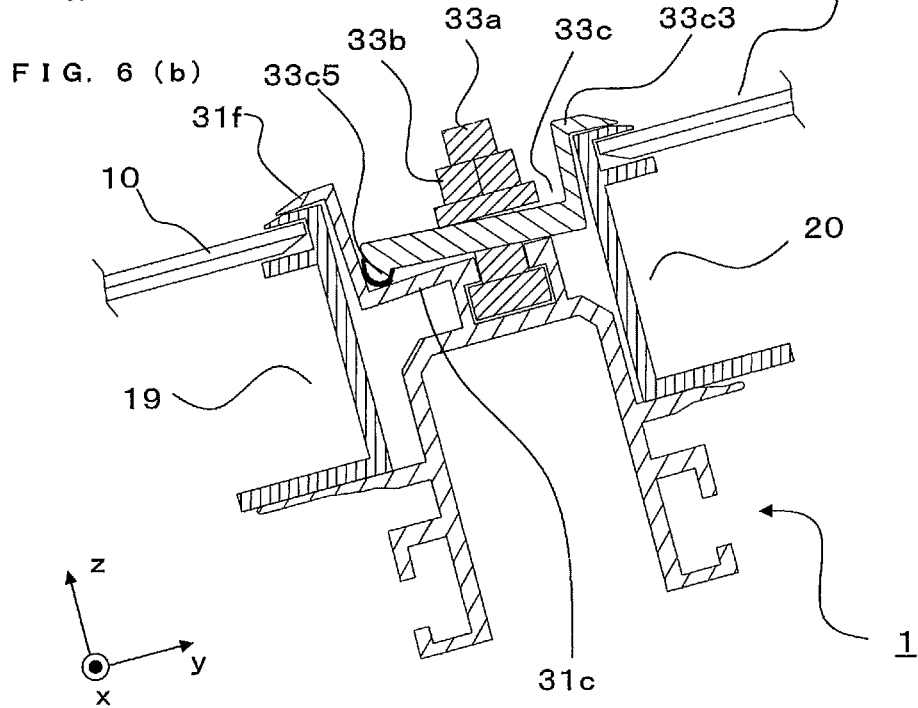

As shown in FIGS. 6(a) and 6(b), a solar cell array 1 according to the present embodiment differs from that according to the first embodiment in the shape of a stopper 33c and a holding member 31. This allows the solar cell array 1 according to the present embodiment to have the following advantages in addition to the advantages according to the above-described first embodiment.

The stopper 33c includes a protrusion 33c5 contacts an extending portion 31c and that is disposed at a lower surface thereof at a side that is distant from a second side portion 20 of a solar cell module 10 and at a side of an end portion of a plate-shaped portion 33c1 that is close to a first supporting portion 31d. Therefore, when the stopper 33c is fastened tightly by a bolt 33a and a nut 33b, the protrusion 33c5 contacts the extending portion 31c. This allows the stopper 33c to be tilted towards the second side portion 20 of the solar cell module 10, and a retaining portion 33c3 to press a second upper end surface 20a to increase securing strength.

Further, in the holding member 31, the extending portion 31c that contacts the protrusion 33c5 may be a base portion of a covering portion 31f that projects in a cantilever manner. By this, as shown, in particular, in FIG. 6(b), by fastening tightly the stopper 33c by the bolt 33a and the nut 33b, the protrusion 33c5 strongly presses the extending portion 31c and is elastically deformed downward. The covering portion 31f can strongly press a first upper end portion 19a of a first side portion 19 of the solar cell module 10, thereby allowing the covering portion 31f to press the first upper end portion 19a.

Therefore, the covering portion 31f can firmly secure the first side portion 19 of the solar cell module 10. Further, by eliminating a gap between the covering portion 31f and the first upper end portion 19a, it is possible to eliminate rattling of the solar cell module 10 when a strong wind blows and, thus, to reduce noise.

<<Third Embodiment>>

Figure 7:
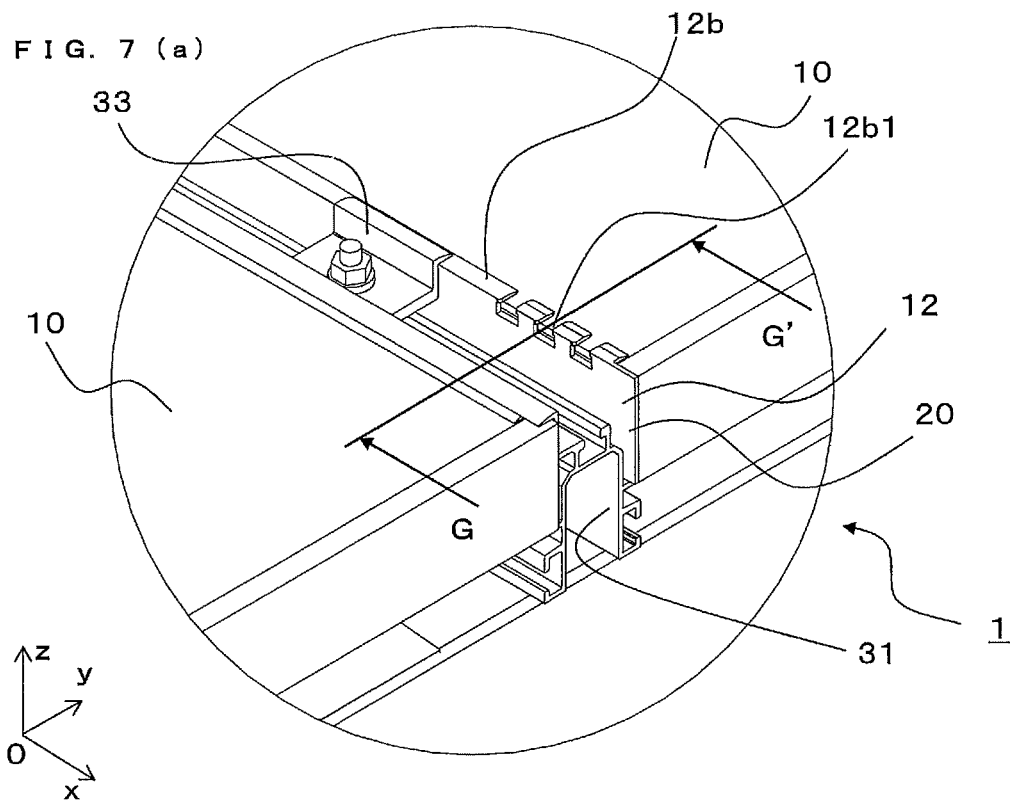
FIGS. 7(a) and 7(b) illustrate a solar cell array according to another embodiment of the present invention, with FIG. 7(a) being an enlarged perspective view of a portion F in FIG. 1(a) and FIG. 7(b) being a sectional view taken along line G-G' in FIG. 7(a).
Figure 7:
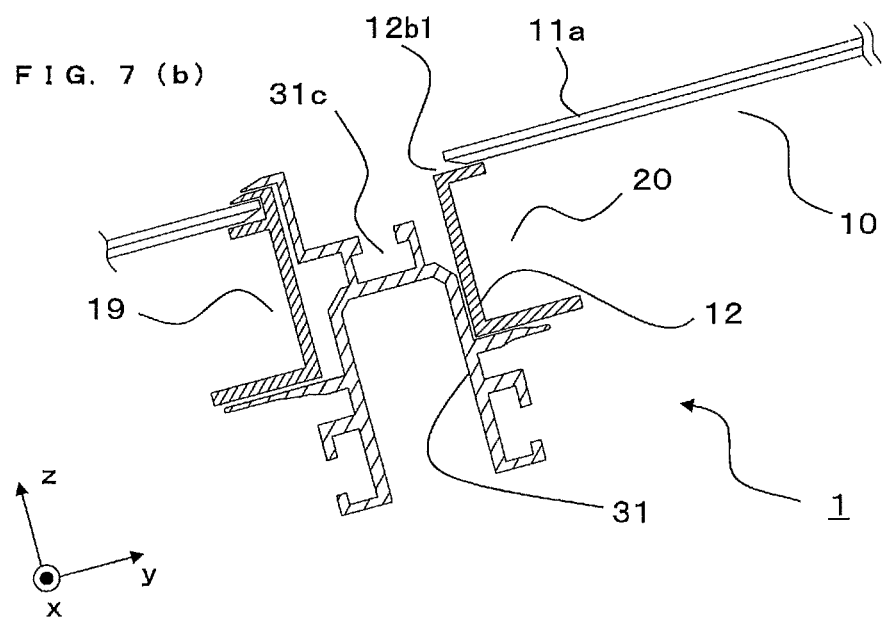

As shown in FIGS. 7(a) and 7(b), a solar cell array 1 according to the present embodiment differs from those according to the first embodiment and the second embodiment in the shape of a second side portion 20. This allows the solar cell array 1 according to the present embodiment to have the following advantages in addition to the advantages according to the above-described first and second embodiments.

A solar cell module 10 includes notches 12b1 in a frame upper surface 12b of a frame member 12 of the second side portion 20. A holding member 31 holds a portion other than the notches 12b1. By this, as shown, in particular, in FIG. 7(b), a step where rainwater accumulates between a light-receiving surface 11a and an extending portion 31c is eliminated, so that it is possible to quickly discharge the rainwater from the notches 12b1. As a result, it is possible to further reduce adhesion of dirt, such as dust, in the rainwater to the first principal surface 11a of a solar cell panel 11, and, thus, further reduce a reduction in generation efficiency caused by the dirt, such as dust.

Although embodiments according to the present invention are exemplified, the present invention is not limited to the above-described embodiments. These may be modified as appropriate into any structures without departing from the object of the present invention. For example, the roof materials of the roof are not limited to roof decks. As long as the roof materials allow the solar cell array to be installed, other roof materials may be used. In addition, the structure where the solar cell array is installed may be something other than the roof.

REFERENCE SIGNS LIST 1 solar cell array
2 roof
2a roof deck
3 rack
10 solar cell module
11 solar cell panel
11a first principal surface
11b second principal surface
12 frame member
12a fitting portion
12b frame upper surface
12b1 notch
12c frame lower surface
12d frame side surface
13 light-transmissive substrate
14 sealing material
15 inner lead
16 solar cell element
17 back-surface protecting member
18 terminal box
19 first side portion
19a first upper end portion
19b first lower end portion
20 second side portion
20a second upper end portion
20b second lower end portion
30 supporting member
30a securing portion
30b placement portion
31 holding member 311 first holding member
312 second holding member
31a first side wall portion
31b second side wall portion
31c extending portion (third supporting portion)
31c1 recessed portion
31c2 opening portion
31d first supporting portion
31e second supporting portion
31f covering portion
32 securing member
33 pressing member
33a bolt
33a1 head
33a2 threaded portion
33b nut
33c stopper
33c1 plate-shaped portion
33c2 connecting portion
33c3 retaining portion
33c4 through hole
33c5 protrusion

The invention claimed is:

1. A solar cell array comprising:
a first solar cell module and a second solar cell module that each include, at external peripheral edge portions in plan view, a first side portion and a second side portion that is opposite to the first side portion,
the first solar cell module and the second solar cell module being arranged side by side in an inclination direction at an inclined surface in such a manner that the first solar cell module is tilted and disposed at a lower side of the inclined surface and the second solar cell module is tilted and disposed at an upper side of the inclined surface to cause the first side portion of the first solar cell module to face the second side portion of the second solar cell module;
a holding member that is interposed between the first side portion of the first solar cell module and the second side portion of the second solar cell module,
wherein the holding member includes:
a first holding portion that holds the first side portion of the first solar cell module and that extends along the first side portion, and
a second holding portion that holds the second side portion of the second solar cell module and that extends along the second side portion,
wherein the first holding portion includes:
a covering portion that covers an upper end portion of the first side portion of the first solar cell module,
a first supporting portion that sandwiches, together with the covering portion, the first side portion and supports a lower end portion of the first side portion, and
a first side wall portion that is positioned between the covering portion and the first supporting portion and that faces the first side portion, and
wherein the second holding portion includes:
a second supporting portion that supports a lower end portion of the second side portion of the second solar cell module,
a second side wall portion that faces the second side portion, and
a third supporting portion that is provided between the first side wall portion and the second side wall portion and that is provided below an upper end surface of the second side portion of the second solar cell module, and
a pressing member which is supported by the third supporting portion and includes a securing portion and a stopper,
wherein the stopper is mounted on the third supporting portion by using the securing portion, extends along the second side portion through a length that is less than a length of the second side portion in a longitudinal direction, sandwiches the second side portion together with the second supporting portion of the second holding portion, and presses the upper end surface of the second side portion.

2. The solar cell array according to claim 1, wherein the stopper contacts and presses the first holding portion.

3. The solar cell array according to claim 1, wherein the covering portion of the holding member presses an upper end surface of the first side portion of the first solar cell module.

4. The solar cell array according to claim 1, wherein the second side portion of the second solar cell module is provided with a frame member including a notch in an upper surface thereof, and the stopper sandwiches a portion of the frame member other than the notch together with the second supporting portion of the second holding portion.

* * * * *